(12) United States Patent
Ha et al.

(10) Patent No.: US 10,355,158 B2
(45) Date of Patent: Jul. 16, 2019

(54) SOLAR CELL AND METHOD FOR MANUFACTURING THE SAME

(71) Applicant: LG Electronics, Inc., Seoul (KR)

(72) Inventors: Jungmin Ha, Seoul (KR); Youngho Choe, Seoul (KR); Philwon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1163 days.

(21) Appl. No.: 13/647,920

(22) Filed: Oct. 9, 2012

(65) Prior Publication Data

US 2013/0228215 A1 Sep. 5, 2013

(30) Foreign Application Priority Data

Mar. 5, 2012 (KR) .................. 10-2012-0022456

(51) Int. Cl.
*H01L 31/18* (2006.01)
*H01L 31/068* (2012.01)

(52) U.S. Cl.
CPC ........ *H01L 31/068* (2013.01); *H01L 31/1804* (2013.01); *Y02E 10/547* (2013.01); *Y02P 70/521* (2015.11)

(58) Field of Classification Search
CPC .............. H01L 31/068; H01L 31/1804; H01L 21/0415; Y02E 10/547
USPC ................................................. 136/243–265
See application file for complete search history.

(56) References Cited

U.S. PATENT DOCUMENTS

| | | | |
|---|---|---|---|
| 4,533,831 A | 8/1985 | Itoh et al. | |
| 2009/0117680 A1 | 5/2009 | Yamazaki et al. | |
| 2009/0242032 A1* | 10/2009 | Yamazaki | H01L 31/02242 136/261 |
| 2012/0152338 A1* | 6/2012 | Ha | H01L 31/02168 136/255 |

FOREIGN PATENT DOCUMENTS

| | | |
|---|---|---|
| DE | 34 34 552 A1 | 4/1985 |
| EP | 2 105 972 A2 | 9/2009 |
| JP | 2011513997 A | 4/2011 |

(Continued)

OTHER PUBLICATIONS

J. Ruzyllo, Surface Contaminants in Semiconductor Manufacturing, Semiconductor Note 14, Sep. 10, 2005, http://www.semi1source.com/notes/ViewFile.asp?Which=67, accessed Sep. 15, 2015.*

(Continued)

*Primary Examiner* — Shannon M Gardner
(74) *Attorney, Agent, or Firm* — Dentons US LLP

(57) ABSTRACT

A method of manufacturing a solar cell according to an embodiment includes the steps of: forming an emitter layer by ion-implanting a first conductive type dopant to a first surface of a semiconductor substrate; and forming a back surface field layer by ion-implanting a second conductive type dopant to a second surface of the semiconductor substrate. When an additional dopant is a dopant other than the first and second conductive type dopants, an amount of the additional dopant doped during the forming the back surface field layer is larger than an amount of the additional dopant doped during the forming the emitter layer.

10 Claims, 9 Drawing Sheets

(56) References Cited

FOREIGN PATENT DOCUMENTS

| KR | 1020090073002 A | 7/2009 |
| KR | 1020090085391 A | 8/2009 |
| KR | 1020100088151 A | 8/2010 |
| KR | 1020120077712 A | 7/2012 |

OTHER PUBLICATIONS

Hartiti B et al: "Back Surface Field-induced gettering in mullicryslalline silicon", Proceedings of the Photovoltaic Specialists Conference, Las Vegas, Oct. 7-11, 1991; [Proceedings of Tiie Piiotovoltaic Specialists Conference], New York, IEEE, US, vol. Conf. 22, Oct. 7, 1991 (Oct. 7, 1991), pp. 998-1001, XP10039359, DOI: 10.1109/PVSC.1991.169359 ISBN: 978-0-87942-636-1 *the whole document*.

Westbrook, R.D., et al. "Glow-discharge-implanted, thermally annealed, oxide-passivated silicon solar cells of 19% efficiency", Applied Physics Letters, vol. 50, No. 8, Feb. 23, 1987, pp. 469-471, XP000816298.

Tahara, Y., et al. "High Throughput Automated Junction Formation by Ion Implantation and Halogen Lamp Anneal for 9MW Production", Photovoltaic Specialists Conference, Las Vegas, Oct. 21-25, 1985, vol. Conf. 18, Oct. 21, 1985, pp. 792-796, XP000132062.

* cited by examiner

ST10

ST20

ST30

ST40

ST50

SOLAR CELL AND METHOD FOR MANUFACTURING THE SAME

CROSS-REFERENCE TO RELATED APPLICATION

This application claims the priority benefit of Korean Patent Application No. 10-2012-0022456, filed on Mar. 5, 2012 in the Korean Intellectual Property Office, the disclosure of which is incorporated herein by reference.

BACKGROUND

1. Field of the Disclosure

The disclosure relates to a solar cell and a method of manufacturing the same, and more particularly, to a solar cell including a dopant layer and a method of manufacturing the same.

2. Description of the Related Art

Recently, as existing energy resources such as oil or coal are expected to be exhausted, an interest in alternative energy for replacing oil or coal is increasing. In particular, a solar cell that directly converts or transforms solar energy into electricity using a semiconductor member is gaining attention.

A solar cell is manufactured by forming a plurality of layers and electrodes according to a design. However, due to the plurality of layers and electrodes, manufacturing cost of the solar cell increases and productivity of the solar cell decreases. Particularly, in a solar cell having a p-n junction formed by a dopant layer, the cost is increased by a process forming the dopant layer. Therefore, a technique being able to enhance properties of the solar cell and to reduce the manufacturing cost of the solar cell is needed.

SUMMARY

Embodiments of the invention are directed to a solar cell and a method of manufacturing the same being able to enhance properties of the solar cell and to reduce a manufacturing cost of the solar cell.

A method of manufacturing a solar cell according to an embodiment includes the steps of: forming an emitter layer by ion-implanting a first conductive type dopant to a first surface of a semiconductor substrate; forming a back surface field layer by ion-implanting a second conductive type dopant to a second surface of the semiconductor substrate. When an additional dopant is a dopant other than the first and second conductive type dopants, an amount of the additional dopant doped during the forming the back surface field layer is larger than an amount of the additional dopant doped during the forming the emitter layer.

A method of manufacturing a solar cell according to an embodiment includes the steps of: forming an emitter layer by ion-implanting a first conductive type dopant to a first surface of a semiconductor substrate; and forming a back surface field layer by ion-implanting a second conductive type dopant to a second surface of the semiconductor substrate. The first conductive type dopant is ion-implanted by an ion-selection using a mass spectrometer in the forming the emitter layer, and the second conductive type dopant is ion-implanted without the ion-selection using the mass spectrometer in the forming the back surface field layer.

A solar cell according to an embodiment includes a semiconductor substrate having a first surface and a second surface opposite to each other; an emitter layer formed at the first surface of the semiconductor substrate, wherein the emitter layer includes a first conductive type dopant; and a back surface field layer formed at the second surface of the semiconductor substrate, wherein the back surface field layer includes a second conductive type dopant. When an additional dopant is a dopant other than the first and second conductive type dopants, the concentration of the additional dopant in the back surface field layer is higher than the concentration of the additional dopant in the emitter layer.

DETAILED DESCRIPTION OF THE EMBODIMENTS

Figure 1:
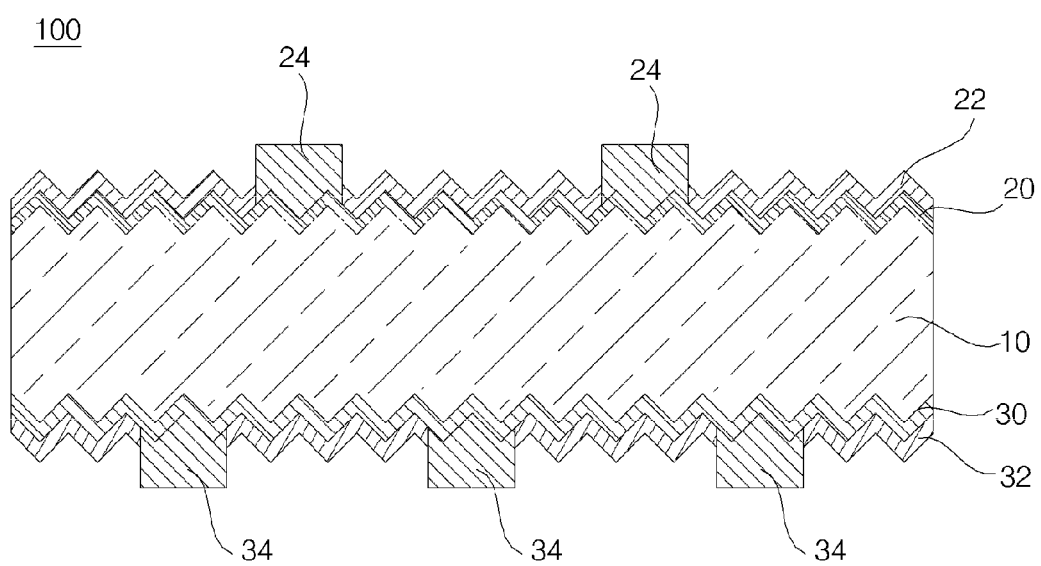
FIG. 1 is a cross-sectional view of a solar cell according to an embodiment of the invention.

Hereinafter, embodiments of the invention will be described with reference to the accompanying drawings. However, the invention is not limited the embodiments, and the various modifications of the embodiments are possible.

In order to clearly and concisely illustrate the embodiments of the invention, members not related to the embodiments of the invention are omitted in the figures. Also, members similar to or the same as each other may have the same reference numerals. In addition, the dimensions of layers and regions may be exaggerated or schematically illustrated, or some layers may be omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be understood that the layer of film is directly on the other layer or substrate, or intervening layers are also present. Further, when a layer or film is referred to as being "directly on" another layer or substrate, it can be understood that the layer or film is directly on the another layer or substrate, and thus, there is no intervening layer.

Hereinafter, a solar cell and a method of manufacturing the same according to embodiments of the invention will be described with reference to the accompanying drawings.

FIG. 1 is a cross-sectional view of a solar cell according to an embodiment of the invention.

Referring to FIG. 1, a solar cell 100 according to an embodiment includes a semiconductor substrate 10, an emitter layer 20 formed at or adjacent to a first surface (hereinafter, referred to as "a front surface") of the semiconductor substrate 10, a back surface field layer 30 formed at or adjacent to a second surface (hereinafter, referred to as "a back surface") of the semiconductor substrate 10, an anti-reflection film 22 and a first electrode (or a plurality of first electrodes) 24 formed on the front surface of the semiconductor substrate 10, and a passivation film 32 and a second electrode (or a plurality of second electrodes) 34 formed on the back surface of the semiconductor substrate 10. This will be described in more detail.

The semiconductor substrate 10 may include one or more of various semiconductor materials. For example, the semiconductor substrate 10 includes silicon having a dopant of a second conductivity type. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When the sunlight is incident to the p-n junction, the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Thus, the electric energy is generated.

Here, the holes having mobility lower than that of the electrodes move to the front surface of the semiconductor substrate 10, and not to the back surface of the semiconductor substrate 10. Therefore, the conversion efficiency of the solar cell 100 can be enhanced.

The front and back surfaces of the semiconductor substrate 10 may be a textured surface to have protruded and/or depressed portions of various shapes (such as pyramid shape). Thus, the surface roughness is increased by the protruded and/or depressed portions, and reflectance of the incident sunlight at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100.

However, the invention is not limited thereto, and thus, the protruded and/or depressed portions may be formed at only one surface (especially, the front surface), or there may be no protruded and/or depressed portions at the front and back surfaces.

The emitter layer 20 of the first conductive type may be formed at the front surface of the semiconductor substrate 10. A p-type dopant such as a group III element (for example, boron (B), aluminum (Al), gallium (Ga), indium (In) or the like) may be used for the first dopant 202. In the embodiment, the emitter layer 20 may be formed by an ion-implantation method, and this will be described later in more detail.

For example, the emitter layer 20 has the surface concentration of about $1.0 \times 10^{18} \sim 1 \times 10^{20}$ atoms/cm$^3$, and has a thickness about 0.3~1.8 μm. The above surface concentration and the thickness are determined with consideration of the photoelectric conversion efficiency and the contact property with the first electrode 24. However, the invention is not limited thereto. Thus, the surface concentration and the thickness may be varied.

The anti-reflection film 22 and the first electrode 24 may be formed on the emitter 20 at the front surface of the semiconductor substrate 10.

The anti-reflection film 22 may be substantially or entirely formed at the front surface of the semiconductor substrate 10, except for the portion where the first electrode 24 is formed. The anti-reflection film 22 reduces reflectance (or reflectivity) of sunlight incident to the front surface of the semiconductor substrate 10. Also, the anti-reflection film 22 passivates defects at a surface or a bulk of the emitter layer 20.

By reducing the reflectance of sunlight incident to the front surface of the semiconductor substrate 10, an amount of the sunlight reaching the p-n junction formed between the semiconductor substrate 10 and the emitter layer 20 can be increased, thereby increasing short circuit current (Isc) of the solar cell 100. Also, by passivating the defects at the emitter layer 20, recombination sites of minority carrier are reduced or eliminated, thereby increasing an open-circuit voltage (Voc) of the solar cell 100. Accordingly, the open-circuit voltage and the short-circuit current of the solar cell 100 can be increased by the anti-reflection film 22, and thus, the efficiency of the solar cell 100 can be enhanced.

The anti-reflection film 22 may include one or more of various materials. For example, the anti-reflection film 22 may include a silicon nitride layer. However, the invention is not limited thereto. Thus, the anti-reflection film 22 may have a single film structure or a multi-layer film structure including, for example, at least one material selected from a group including silicon nitride, silicon nitride including hydrogen, silicon oxide, silicon oxy nitride, $MgF_2$, ZnS, $TiO_2$, and $CeO_2$. Here, when the anti-reflection film 22 includes $Al_2O_3$ layer formed on (for example, formed directly on) the emitter layer 20 and a silicon nitride layer formed on (for example, formed directly on) the $Al_2O_3$ layer, the passivation property of the emitter layer 20 of the p-type can be maximized. However, the invention is not limited thereto. The anti-reflection film 22 may include one or more of various materials.

The first electrode 24 is electrically connected to the emitter layer 20 by penetrating the anti-reflection film 22 at the front surface of the semiconductor substrate 10. The first electrode 24 may include one or more of various metals having high electrical conductivity. For example, the first electrode 24 may include silver (Ag) having high electrical conductivity. However, the invention is not limited thereto. The first electrode 24 may be a single layer including transparent conductive materials, or may have a stacked structure having a transparent conductive layer and a metal layer (called "a bus bar" or "a finger electrode") on the transparent conductive layer.

Also, the back surface field layer 30 including the second conductive type dopant is formed at the back surface of the semiconductor substrate 10. The conductive type dopant of the back surface field layer 30 may be the same as or different from the conductive type dopant of the semiconductor substrate 10 where the emitter layer 20 and the back surface field layer 30 are not formed.

The back surface field layer 30 can minimize the recombination of the electrons and the holes, and enhance the efficiency of the solar cell 100. The back surface field layer 30 may include phosphorus (P), arsenic (As), bismuth (Bi), antimony (Sb), or the like as the second conductive type dopant. In the embodiment, the back surface field layer 30 may be formed by an ion-implantation method, and this will be described later in more detail.

For example, the surface concentration of the second conductive type dopant in the back surface field layer 30 is in a range of about $1.0 \times 10^{18} \sim 5 \times 10^{21}$ atoms/cm$^3$, and a thickness of the back surface field layer 30 is about 0.3~1.8 μm. The above surface concentration and the thickness are determined with consideration of the back surface field effect and the contact property with the second electrode 34. The surface concentration of the second conductive type dopant in the back surface field layer 30 may be higher than the surface concentration of the first conductive type dopant in the emitter layer 20. However, the invention is not limited thereto. Thus, the surface concentration and the thickness of the back surface field layer 30 may be varied.

The passivation film 32 and the second electrode 34 may be formed at the back surface of the semiconductor substrate 10.

The passivation film 32 may be substantially or entirely formed at the back surface of the semiconductor substrate 10, except for the portions where the second electrode 34 is formed. The passivation film 32 passivates defects at the back surface of the semiconductor substrate 10, and eliminates the recombination sites of minority carrier. Thus, an open circuit voltage of the solar cell 100 can be increased.

The passivation film 32 may include a transparent insulating material for passing the light. Thus, the light can be incident to the back surface of the semiconductor substrate 10 through the passivation film 32, and thereby enhancing the efficiency of the solar cell 100. The passivation film 32 may have a single film structure or a multi-layer film structure including, for example, at least one material selected from a group including silicon nitride, silicon nitride including hydrogen, silicon oxide, silicon oxy nitride, MgF$_2$, ZnS, TiO$_2$, and CeO$_2$. However, the invention is not limited thereto, and thus, the passivation film 32 may include one or more of various materials.

The second electrode 34 may include a metal having a high electric conductivity. For example, the second electrode 34 may include silver (Ag) having high electrical conductivity and high reflectance. When the second electrode 34 includes the silver having high reflectance, the second electrode 34 can reflect the light toward the back surface of the semiconductor substrate 10 and the light is reflected toward the inside of the semiconductor substrate 10. Thus, the amount of the light captured can be increased.

The second electrode 34 may have a width larger than that of the first electrode 24, and a number of the second electrode 34 may be greater than that of the first electrode 24. Accordingly, the total area of the second electrode 34 may be larger than that of the first electrode 24. However, the invention is not limited thereto.

In the embodiment, the semiconductor substrate 10 is the n-type, and the emitter layer 20 is the p-type. However, the invention is not limited thereto. Therefore, the semiconductor substrate 10 may be the p-type, and the emitter layer 20 may be the n-type. That is, various modifications are possible.

As mentioned above, in the embodiment, each of the emitter layer and the back surface field layer 30 is formed by the ion-implantation method. Here, the emitter layer 20 and the back surface field layer 30 are formed under different conditions. Especially, the concentrations of an additional dopant other than the first and second conductive type dopants in the emitter layer and the back surface field layer 30 are different. More specifically, the first conductive type dopant is ion-implanted by an ion-selection using a mass spectrometer when the emitter layer 20 is formed. On the other hand, the second conductive type dopant is ion-implanted without the ion-selection using the mass spectrometer when the back surface field layer 30 is formed. Accordingly, the concentration of the additional dopant in the back surface field layer 30 is higher than the concentration of the additional dopant in the emitter layer 20. This will be described later in more detail.

The additional dopant may include hydrogen. For example, in at least a region of the back surface field layer, the hydrogen concentration may be higher than the concentration of the second conductive type dopant. More particularly, a portion of the back surface field layer 30 apart from the back surface of the semiconductor substrate 10 by about 0.1~0.4 μm may include an region having the hydrogen concentration (for example, in a range of about $1 \times 10^{18} \sim 1 \times 10^{20}$ atoms/cm$^3$) higher than the concentration of the second conductive type dopant. The hydrogen concentration of the back surface field layer 30 is determined in order to reduce the contact resistance with the second electrode 34 while maintaining the other properties. However, the invention is not limited thereto. On the other hand, in a portion of the emitter layer 20 apart from the front surface of the semiconductor substrate 10 by about 0.1~0.4 μm, the hydrogen concentration may be smaller than the first conductive type dopant, and the hydrogen concentration of the portion may be in a range of about $1 \times 10^{15} \sim 9 \times 10^{17}$ atoms/cm$^3$. The hydrogen concentration of the emitter layer 20 is determined so that various properties can be maintained. However, the invention is not limited thereto. Here, the surface of the semiconductor substrate 10 is a surface of the semiconductor substrate 10 including the emitter layer 20 or the back surface field layer 30.

In the embodiment, the concentration of the additional dopant in the back surface field layer 30 is higher than the concentration of the additional dopant in the emitter layer 20. Thus, the contact resistance with the second electrode 34 can be reduced by the additional dopant of the back surface field layer 30, while maintaining the other properties of the solar cell 100.

In more detail, when the additional dopant other than the first conductive type dopant is included in the emitter layer 20, generated carriers are captured by defects and the current by short wavelength may decrease. That is, when the amount of the additional dopant in the emitter layer 20 increases, the properties of the solar cell 100 may be deteriorated. Accordingly, in the embodiment, when the first conductive type dopant is ion-implanted in order to form the emitter layer 20, the amount of the additional dopant is reduced (preferably, the additional dopant is not included in the emitter layer 20). Therefore, the properties of the solar cell 100 can be maintained.

On the other hand, the surface concentration of the second conductive type dopant in the back surface field layer 30 is higher than the surface concentration of the first conductive type dopant in the emitter layer 20. Therefore, the additional dopant rarely influences to the properties of the solar cell 100. Also, the area of the second electrode 34 is larger than that of the first electrode 24. That is, the contact resistance with the second electrode 34 having a relatively large area can be reduced. Accordingly, fill factor of the solar cell 100 can be enhanced.

Also, during the ion-implanting for forming the back surface field layer 30, the mass spectrometer is not used and the manufacturing cost can be effectively reduced.

Hereinafter, a method for forming a solar cell 100 (particularly, the steps of forming an emitter layer 20 and a back surface field layer 30) will be described in more detail. In the following description, the described portions in the above will be omitted, and the not-described portions in the above will be described in detail.

Figure 2:
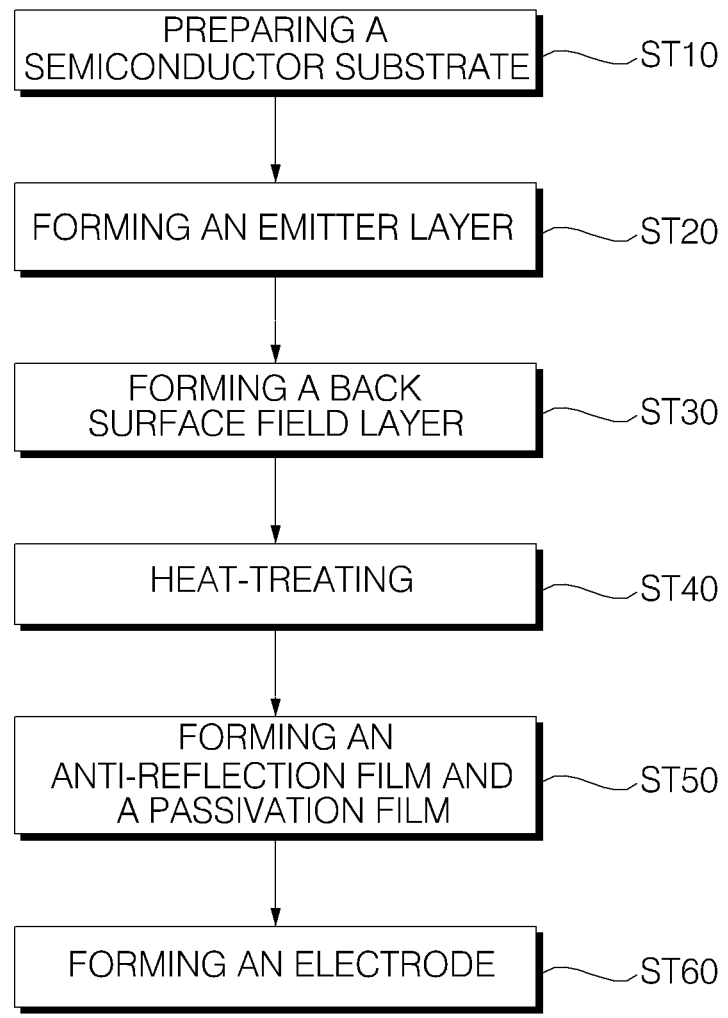
FIG. 2 is a block diagram illustrating a method of manufacturing a solar cell according to an embodiment of the invention.

FIG. 2 is a block diagram for illustrating a method of manufacturing a solar cell according to an embodiment of the invention.

Referring to FIG. 2, a method of manufacturing a solar cell according to the embodiment includes a step ST10 for preparing a semiconductor substrate, a step ST20 for forming an emitter layer, a step ST30 for forming a back surface field layer, a step ST40 for heat-treating, a step ST50 for forming an anti-reflection film and a passivation film, and a step ST60 for forming an electrode.

Figure 3A:
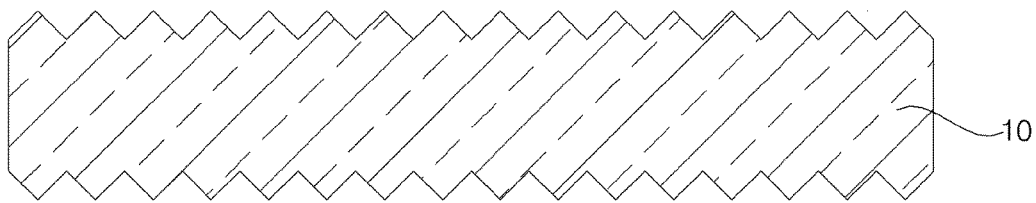
FIGS. 3a to 3f are cross-sectional views illustrating the method of manufacturing the solar cell according to an embodiment of the invention.

First, as shown in FIG. 3a, in the step ST10 for preparing the semiconductor substrate, a semiconductor substrate 10 having a second conductive type dopant is prepared. The front and back surfaces of the silicon semiconductor substrate 10 may be textured to have protruded and/or dented portions of various shapes (or to have an uneven surface). For the texturing method, a wet etching method or a dry etching method may be used. In the wet etching method, the substrate 10 may be dipped into a texturing solution. According to the wet etching method, the process time can be short. In the dry etching method, the surface of the semiconductor substrate 10 is etched by a diamond drill or a laser. In the dry etching, the protruded and/or dented portions can be uniformly formed; however, the semiconductor substrate 10 may be damaged and the process time may be long. Accordingly, the semiconductor substrate 10 may be textured by one or more of various methods.

Figure 3B:
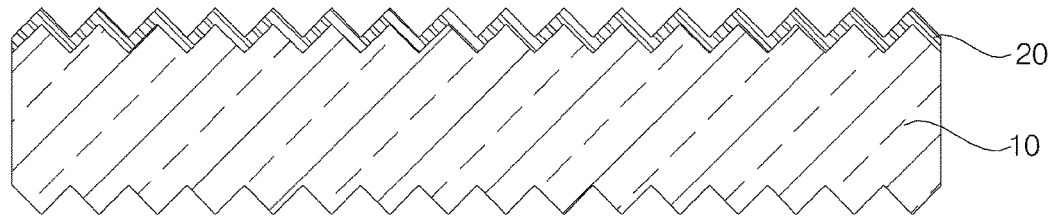

Next, as shown in FIG. 3b, in the step ST20 for forming the emitter layer, an emitter layer 20 is formed at the front surface of the semiconductor substrate 10 by ion-implanting a first conductive type dopant. More specifically, as shown in FIG. 4, the first conductive type dopant is ion-implanted by an ion-selection using a mass spectrometer 220.

Figure 4:
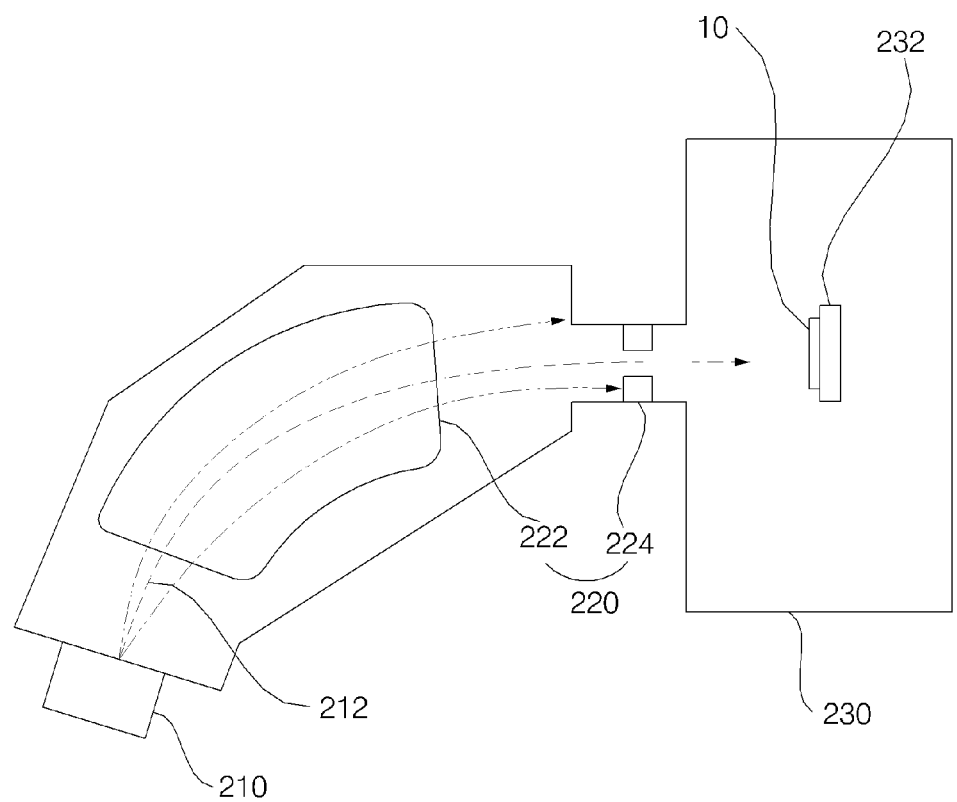
FIG. 4 is a schematic diagram illustrating an example of an ion-implantation apparatus used in a step of forming an emitter layer in the method of manufacturing the solar cell according to an embodiment of the invention.

FIG. 4 is a schematic diagram for illustrating an example of an ion-implantation apparatus used in a step of forming the emitter layer in the method of manufacturing the solar cell according to an embodiment of the invention. The elements not directly related to the embodiment (for example, a deflector, an accelerator, and so on) will not shown in FIG. 4 and not be further described. However, the invention is not limited thereto. Thus, various elements may be applied to the ion-implantation apparatus.

The ion-implantation apparatus 200 according to the embodiment includes an ion source 210 supplying ion corresponding to the ion-implanted dopant, a mass spectrometer 220 for performing an ion-selection by a mass spectrometry of an ion beam 212 supplied by the ion source 210, and an ion-implantation chamber 230 where the ion-implantation is performed.

The ion source 210 may be an ion supplier having a structure of known structures and being driven by a method of known methods.

The mass spectrometer 220 may include a mass spectrometry magnet 222 providing magnetic field to the ion beam 212 and a mass spectrometry slit 224 having passages where only the predetermined ion passes through.

A semiconductor substrate 10 is fixed to a holder 232 in the ion-implantation chamber 230 in order for the ion passing through the mass spectrometry slit 224 to implant to the semiconductor substrate 10. The holder 232 may move up and down and/or left and right, and one of known structures may be applied for the movement.

A mass spectrometry of the ion beam 212 supplied from the ion source 210 is performed by the mass spectrometry magnet 222 and the mass spectrometry slit 224.

That is, the first conductive type dopant, which is used for the ion-implantation among the ion beam 212, travels the path that is formed by the mass spectrometry magnet 222 (refer to a dotted line of FIG. 4) and able to pass through the mass spectrometry slit 224. Here, for high purity, the first conductive type dopant having atomic weight of a predetermined range pass through the mass spectrometry slit 224 only. Also, the ion, which is not used for the ion-implantation among the ion beam 212, travels the path that is formed by the mass spectrometry magnet 222 (refer to an alternated long and short dash line of FIG. 4) and not able to pass through the mass spectrometry slit 224. Hereby, the first conductive type dopant, which is used for the ion-implantation among the ion beam 212, is ion-selected and passes through the mass spectrometry slit 224.

The ion passing through the mass spectrometry slit 224 is implanted to the semiconductor substrate 10, thereby forming the emitter layer 20 at the semiconductor substrate 10, as shown in FIG. 3b. For example, the dose of the hydrogen may be about $5 \times 10^{13}$ atoms/cm$^2$ or less.

Figure 3C:
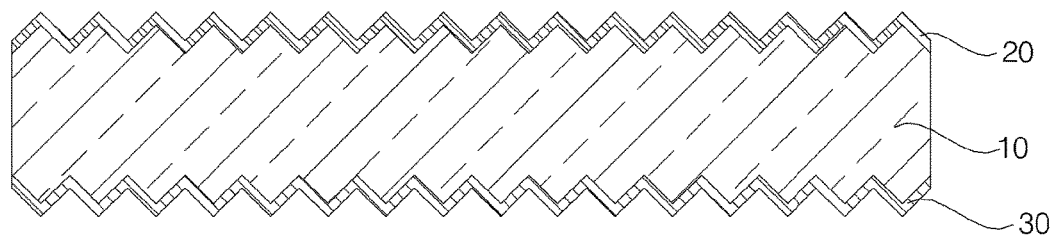
Figure 3D:
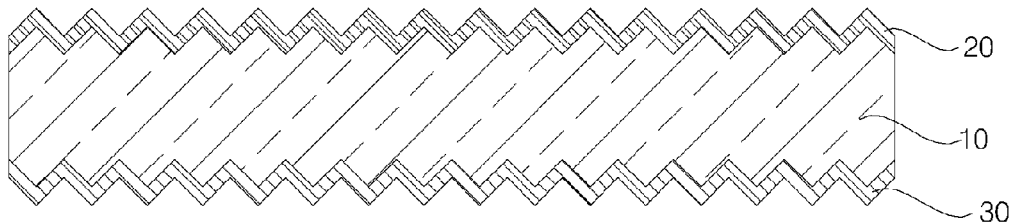

Next, as shown FIG. 3c, in the step ST30 for forming the back surface field layer, a back surface field layer 30 is formed at the back surface of the semiconductor substrate 10 by ion-implanting a second conductive type dopant. Here, the second conductive type dopant for forming the back surface field layer 30 is ion-implanted without the ion-selection that uses the mass spectrometer.

Accordingly, an amount of the additional dopant in the back surface field layer 30 is larger than an amount of the additional dopant in emitter layer 20. For example, the additional dopant may include hydrogen, and the dose of the hydrogen may be about $1 \times 10^{14} \sim 5 \times 10^{15}$ atoms/cm$^2$ in the step ST30 for forming the back surface field layer. The additional dopant may further include at least one additional material selected from the group including potassium (K), calcium (Ca), chrome (Cr), manganese (Mn), iron (Fe), nickel (Ni), and copper (Cu).

As in the above, in the ion-implantation for the back surface field layer 30 that does not directly influence the properties of the solar cell 100, the ion-selection using the mass spectrometer is not performed. Accordingly, the contact resistance with the second electrode 34 can be reduced while maintaining the other properties of the solar cell 100. Also, the mass spectrometer is not used, and thus, the manufacturing cost can be reduced.

In the above, the back surface field layer 30 is formed after the emitter layer 20 is formed. However, the invention is not limited thereto. Thus, the emitter layer 20 can be formed after the back surface field layer 30 is formed.

Next, in the step ST40 for heat-treating, the first conductive type dopant ion-implanted for forming the emitter layer 20 and the second conductive type dopant ion-implanted for forming the back surface field layer 30 are activated by annealing the semiconductor substrate 10.

When the first and second conductive type dopants are ion-implanted to the semiconductor substrate 10, the first and second conductive type dopants are not activated since the dopant are not positioned at the lattice sites. By annealing the semiconductor substrate 10, the first and second conductive type dopants of the emitter layer 20 and the back surface field layer 30 move to the lattice sites and are activated. Also, the first and second conductive type dopants diffuse into the inside of the semiconductor substrate 10.

The heat-treating processes for activating the first and second conductive type dopants may be performed simultaneously or sequentially. Here, when the heat-treating process for activating the first and second conductive type dopants is performed simultaneously, the process can be simplified.

The temperature and the other conditions may be varied according to materials of the first and second conductive type dopants and the semiconductor substrate 10. For example, the temperature may be about 950~1300° C. However, the invention is not limited thereto.

The hydrogen concentration in the back surface field layer 30 after the heat-treating at step ST40 may decrease, compared with before the heat treating at step ST40. Accordingly, the solar cell 100 is not deteriorated. In this case, the hydrogen concentration in the back surface field layer 30 is higher than hydrogen concentration in the emitter layer 20.

For example, after the heat-treating at step ST40, a portion of the back surface field layer 30 apart from the back surface of the semiconductor substrate 10 by about 0.1~0.4 μm may include a region having the hydrogen concentration in a range of about $1 \times 10^{18} \sim 1 \times 10^{20}$ atoms/cm$^3$. On the other hand, after the heat-treating at step ST40, a portion of the emitter layer 20 apart from the front surface of the semiconductor substrate 10 by about 0.1~0.4 μm may include a region having the hydrogen concentration in a range of about $1 \times 10^{15} \sim 9 \times 10^{17}$ atoms/cm$^3$.

However, the invention is not limited thereto. After the heat-treating at step ST40, the hydrogen concentration in the back surface field layer 30 may fall to a level similar to the hydrogen concentration in the emitter layer 20.

Also, after the heat-treating at step ST40, the additional material such as potassium, calcium, chrome, manganese, iron, nickel, and copper may be included to a ND (not-detected) level that is regarded as "not included". That is, the additional material such as potassium, calcium, chrome, manganese, iron, nickel, and copper is not detected. Thus, the other properties of the solar cell 100 can be maintained.

Figure 3E:
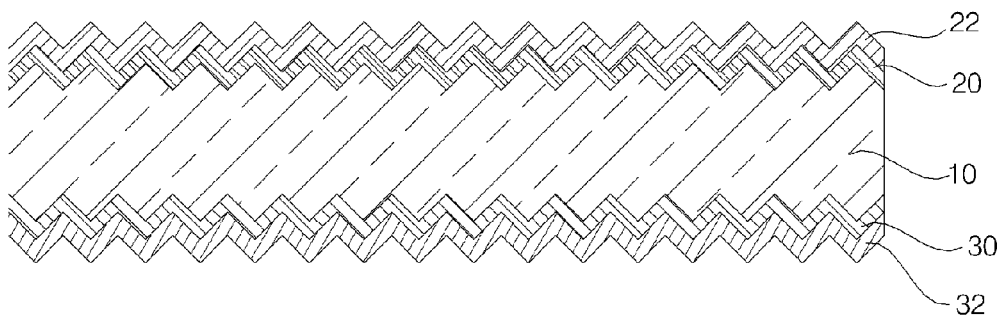

Next, as shown in FIG. 3e, in the step ST50 for forming the anti-reflection film and the passivation film, the anti-reflection film 22 and the passivation film 32 are formed on the front surface and the back surface of the semiconductor substrate 10, respectively.

The anti-reflection film 22 and the passivation film 32 may be formed by one or more of various methods such as a vacuum evaporation, a chemical vapor deposition, a spin coating, a screen printing, or a spray coating.

Figure 3F:
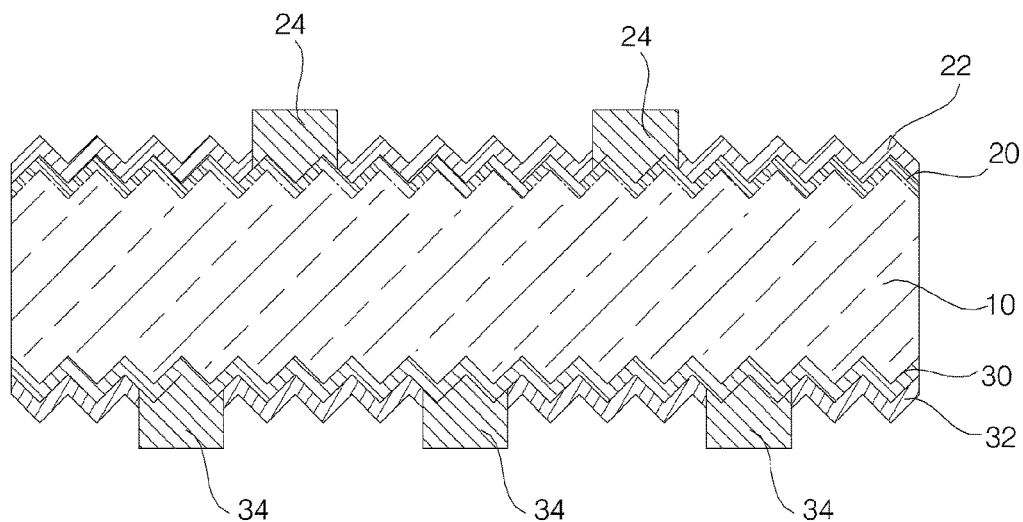

Next, as shown in FIG. 3f, in the step ST60 for forming the electrode, a first electrode 24 electrically connected to the emitter layer 20 is formed at the front surface of the semiconductor substrate 10 and a second electrode 34 electrically connected to the back surface field layer 30 (or, the semiconductor substrate 10) is formed at the back surface of the semiconductor substrate 10.

After forming an opening at the anti-reflection film 22, the first electrode 24 may be formed inside the opening by one or more of various methods, such as a plating method or a deposition method. Also, after forming an opening at the passivation film 32, the second electrode 34 may be formed inside the opening by one or more of various methods, such as a plating method or a deposition method.

Selectively, the first and second electrodes 24 and 34 may be formed by fire-through or laser firing contact of printed pastes for the first and second electrodes 24 and 34. For example, the pastes may be printed by one or more of various methods such as a screen printing method. In this case, because the openings are naturally formed during the fire-through or the laser firing contact, the steps for forming the openings are not necessary.

In the above, each of the emitter layer 20 and the back surface field layer 30 has uniform doping concentration. However, the invention is not limited thereto. At least one of the emitter layer 20 and the back surface field layer 30 may have a selective structure.

Figure 5:
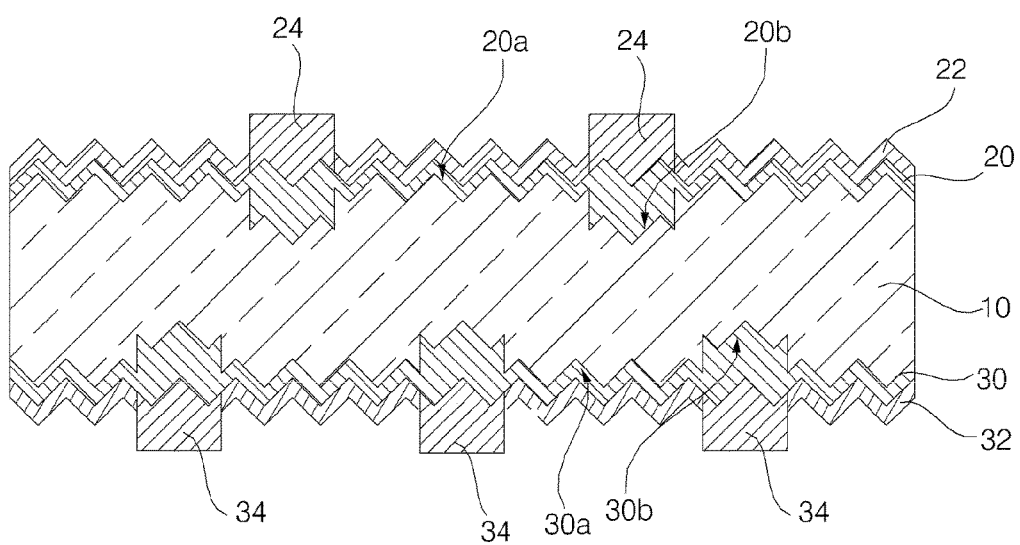
FIG. 5 is a cross-sectional view of a solar cell according to another embodiment of the invention.

That is, as shown in FIG. 5, the emitter layer 20 includes a first portion 20a formed adjacent to the anti-reflection film 22 between the front electrode 24, and a second portion 20b being in contact with the front electrode 24. The second portion 20b has a doping concentration higher than that of the first portion 20a, and thus, the second portion 20b has a resistance lower than that of the first portion 20a.

Then, a shallow emitter can be achieved at the first portion 20a where the sunlight is incident, and thereby enhancing the efficiency of the solar cell 100. In addition, contact resistance with the front electrode 24 can be reduced at the second portion 20b being in contact with the front electrode 24. That is, when the emitter layer 20 has the selective emitter structure, the efficiency of the solar cell 100 can be maximized.

Also, the back surface field layer 30 includes a first portion 30a formed at a portion corresponding to a portion between the back electrode 34, and a second portion 30b being in contact with the back electrode 34. The second portion 30b has a doping concentration higher than that of the first portion 30a, and thus, the second portion 30b has a resistance lower than that of the first portion 30a.

Then, the first portion 30a of the back surface field layer 30 effectively prevents the recombination of the electrons and the holes, and the contact resistance with the back electrode 34 can be reduced by the second portion 30b having a relatively low resistance. Therefore, the loss by the recombination of the electrons and the holes is reduced, and the electrons or the holes generated by the photoelectric effect can be effectively transferred to the back electrode 34. Accordingly, the efficiency of the solar cell 100 can be improved more.

The emitter layer 20 and the back surface field layer 30 having the selective structures may be formed by one or more of various methods. For example, a comb mask may be used so that the second portions 20b and 30b have a relatively high doping concentration and the first portions 20a and 30a have a relatively low doping concentration. Selectively, the emitter layer 20 and the back surface field layer 30 having the selective structures may be formed by additionally doping the dopant only to the second portions 20b and 30b.

Hereinafter, embodiments of the invention will be described in more detail through an experimental example. The experimental example is provided only for illustrative purpose of the embodiments of the invention and the embodiments of the invention are not limited thereto.

Experimental Embodiment

An n-type semiconductor substrate was prepared. Boron as a p-type dopant was ion-implanted to a front surface of the semiconductor substrate to form an emitter layer, and phosphorus as a n-type dopant was ion-implanted to a back surface of the semiconductor substrate to form a back surface field layer. A co-activation was performed by annealing the semiconductor substrate at 1000° C. Here, an ion-selection using a mass spectrometer was performed during the ion-implantation forming the emitter layer; however, the ion-selection using the mass spectrometer was not performed during the ion-implantation forming the back surface field layer.

An anti-reflection film was formed on the front surface of the semiconductor substrate, and a passivation film was formed on the back surface of the semiconductor substrate. Then, a first electrode electrically connected to the emitter layer and a second electrode electrically connected to the back surface field layer were formed, and a solar cell was manufactured.

Comparative Example

A solar cell was manufactured by the same method in Experimental Embodiment except that an ion-selection was performed in the ion-implantation for forming the back surface field layer.

Figure 6:
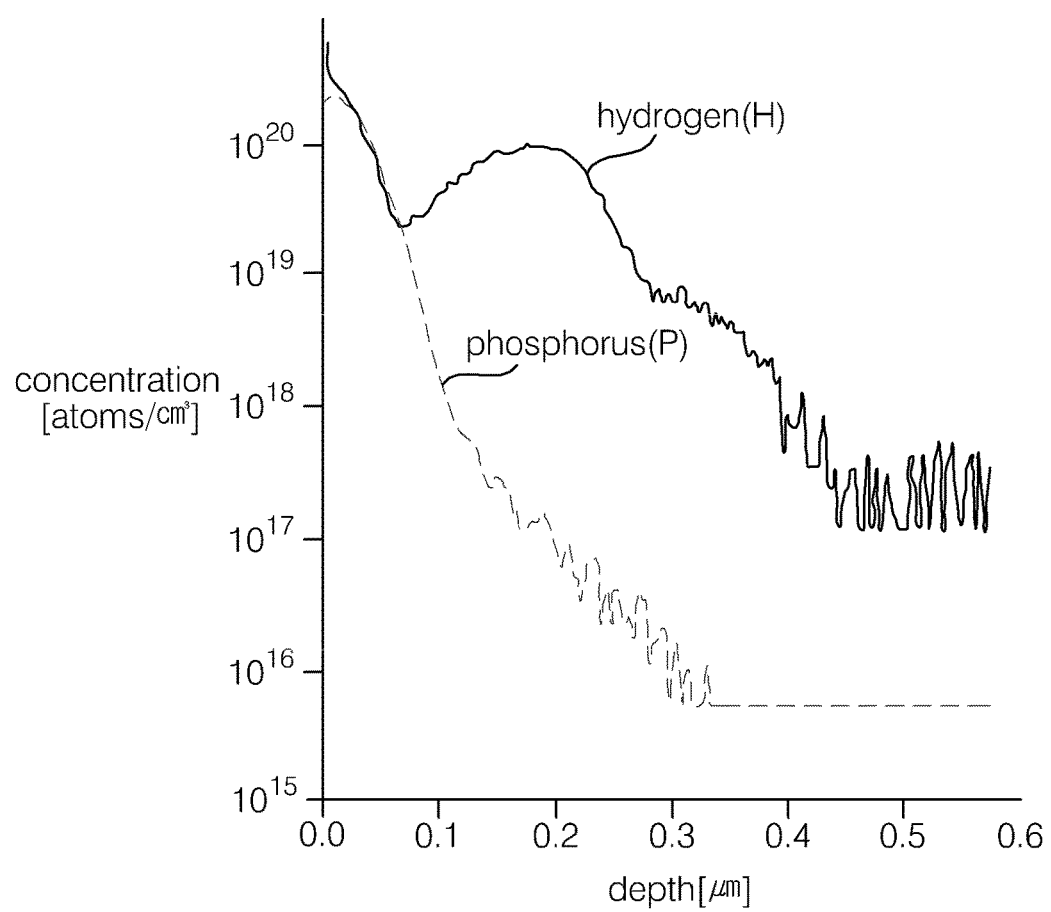
FIG. 6 is a graph of phosphorous concentration and hydrogen concentration with respect to a depth from a surface of a semiconductor substrate of a solar cell manufactured by Experimental Embodiment.
Figure 7:
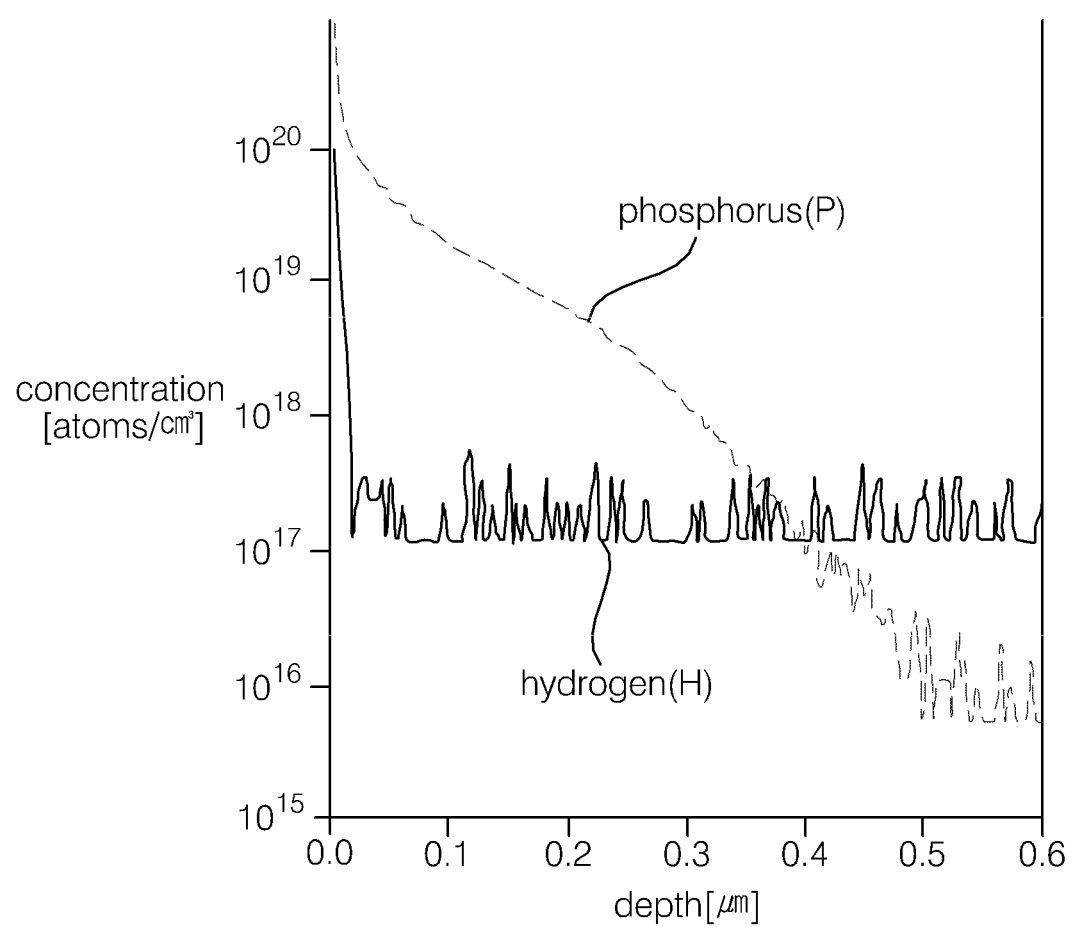
FIG. 7 is a graph of phosphorous concentration and hydrogen concentration with respect to a depth from a surface of a semiconductor substrate of a solar cell manufactured by Comparative Example.

A dose of the additional dopant (hydrogen) during the ion-implantation for forming the back surface field layer in Experimental Embodiment and Comparative Example are shown in Table 1. Phosphorous concentration and hydrogen concentration with respect to a depth from a surface of a semiconductor substrate of a solar cell manufactured by Experimental Embodiment and Comparative Example are shown in FIGS. 6 and 7, respectively. Also, the additional materials were detected by a total reflection X-ray fluorescence spectrometer after the heat-treating in Experimental Embodiment, and the result is shown in Table 2.

TABLE 1

|  | Experimental Embodiment | Comparative Example |
| --- | --- | --- |
| Dose of an additional dopant | $1 \times 10^{15}$ atoms/cm$^2$ | $5 \times 10^{13}$ atoms/cm$^2$ |

TABLE 2

|  | Potassium | calcium | chrome | manganese | iron | nickel | copper |
| --- | --- | --- | --- | --- | --- | --- | --- |
| Detection level | ND(Not detected) | ND | ND | ND | ND | ND | ND |

Referring to Table 1, the dose of the additional dopant in Experimental Embodiment is larger than that in Comparative Example.

Referring to FIG. 6, it can be seen that a portion of the back surface field layer apart from the surface of the semiconductor substrate by about 0.1~0.4 μm may include an region having the hydrogen concentration in a range of about $1 \times 10^{18}$~$1 \times 10^{20}$ atoms/cm$^3$. In the hydrogen concentration range, the contact resistance with the second electrode can be reduced and the other properties of the back surface field layer can be maintained. On the other hand, in Comparative Example, the hydrogen concentration in the back surface field layer is in a range about $1 \times 10^{17}$ atoms/cm$^3$. That is, it can be seen that the hydrogen concentration in the back surface field layer in Comparative Example is low.

Also, referring to Table 2, an additional material such as potassium, calcium, and so on is not detected at the back surface field layer in Experimental Embodiment. That is, the solar cell according to Experimental Embodiment does not deteriorate and the other properties are maintained.

According to the embodiment, the concentration of the additional dopant in the back surface field layer is higher than the concentration of the additional dopant in the emitter layer. And thus, the contact resistance of the back surface field layer with the second electrode can be increased by the additional dopant of the back surface field layer, while maintaining the other properties of the solar cell.

Also, because the mass spectrometer is not used during the ion-implantation for forming the back surface field layer, the manufacturing cost can be effectively reduced.

Certain embodiments of the invention have been described. However, the invention is not limited to the specific embodiments described above; and various modifications of the embodiments are possible by those skilled in the art to which the invention belongs without leaving the scope defined by the appended claims.

What is claimed is:

1. A method of manufacturing a solar cell, comprising:
   forming an emitter layer by ion-implanting a first dopant having a first conductive type to a first surface of a semiconductor substrate; and
   forming a back surface field layer by ion-implanting a second dopant having a second conductive type opposite to the first conductive type to a second surface of the semiconductor substrate,
   the emitter layer including hydrogen, wherein an amount of hydrogen doped during the forming the back surface field layer is larger than an amount of hydrogen doped during the forming the emitter layer, and
   heat-treating for an activation for the emitter layer and the back surface field layer simultaneously, after the forming the emitter layer and the forming the back surface field layer,
   wherein the first dopant is ion-implanted by an ion-selection using a mass spectrometer in the forming the emitter layer, and
   wherein the second dopant is ion-implanted without the ion-selection using the mass spectrometer in the forming the back surface field layer,
   wherein concentration of additional dopant of the emitter layer is larger than concentration of additional dopant of the back surface field layer,
   wherein the additional dopant include hydrogen and at least one additional material selected from the group consisting of potassium (K), calcium (Ca), chrome (Cr), manganese (Mn), iron (Fe), nickel (Ni), and copper (Cu).

2. The method according to claim 1, wherein a dose of the hydrogen is in a range of about $1 \times 10^{14}$~$5 \times 10^{15}$ atoms/cm$^2$ in the forming the back surface field layer.

3. The method according to claim 1, wherein a hydrogen concentration in the back surface field layer after the heat-treating is higher than a hydrogen concentration in the emitter layer after the heat-treating.

4. The method according to claim 3, wherein the hydrogen concentration in the back surface field layer after the heat-treating is lower than the hydrogen concentration in the back surface field layer before the heat-treating.

5. The method according to claim 4, wherein a portion of the back surface field layer at a distance from the second surface of the semiconductor substrate by about 0.1~0.4 μm includes an region having the hydrogen concentration in a range of about 1×1018~1×1020 atoms/cm3 after the heat-treating.

6. The method according to claim 1, wherein the concentration of the second dopant in the back surface field layer is higher than the concentration of the first dopant in the emitter layer.

7. A method of manufacturing a solar cell, comprising:
forming an emitter layer by ion-implanting a first dopant having a first conductive type to a first surface of a semiconductor substrate;
forming a back surface field layer by ion-implanting a second dopant having a second conductive type opposite to the first conductive type to a second surface of the semiconductor substrate,
wherein the first dopant is ion-implanted by an ion-selection using a mass spectrometer in the forming the emitter layer, and
wherein the second dopant is ion-implanted without the ion-selection using the mass spectrometer in the forming the back surface field layer, and
the emitter layer including hydrogen, wherein an amount of hydrogen doped during the forming the back surface field layer is larger than an amount of hydrogen doped during the forming the emitter layer, and
heat-treating for an activation for the emitter layer and the back surface field layer simultaneously, after the forming the emitter layer and the forming the back surface field layer,
wherein concentration of additional dopant of the emitter layer larger than concentration of additional dopant of the back surface field layer,
wherein the additional dopant include hydrogen and at least one additional material selected from the group consisting of potassium (K), calcium (Ca), chrome (Cr), manganese (Mn). Iron (Fe), nickel (Ni), and copper (Cu).

8. The method according to claim 7, wherein a dose of the hydrogen is in a range of about $1\times10^{14}$~$5\times10^{15}$ atoms/cm$^2$ in the forming the back surface field layer.

9. The method according to claim 7, further comprising:
wherein a hydrogen concentration in the back surface field layer after the heat-treating is higher than a hydrogen concentration in the emitter layer after the heat-treating.

10. The method according to claim 9, wherein a portion of the back surface field layer at a distance from the second surface of the semiconductor substrate by about 0.1~0.4 μm includes an region having the hydrogen concentration in a range of about 1×1018~1×1020 atoms/cm3 after the heat-treating.

* * * * *